(12) United States Patent
Sharma et al.

(10) Patent No.: US 7,154,318 B2
(45) Date of Patent: Dec. 26, 2006

(54) INPUT/OUTPUT BLOCK WITH PROGRAMMABLE HYSTERESIS

(75) Inventors: Manoj Kumar Sharma, New Delhi (IN); Rajesh Kaushik, Hisar (IN)

(73) Assignee: STMicroelectronics PVT. Ltd., Uttar Pradesh (IN)

( * ) Notice: Subject to any disclaimer, the term of this patent is extended or adjusted under 35 U.S.C. 154(b) by 12 days.

(21) Appl. No.: 10/993,132

(22) Filed: Nov. 18, 2004

(65) Prior Publication Data

US 2005/0127970 A1   Jun. 16, 2005

(30) Foreign Application Priority Data

Nov. 18, 2003   (IN) .................................... 1430/03

(51) Int. Cl.
*H03K 3/356* (2006.01)
(52) U.S. Cl. .................................... 327/206
(58) Field of Classification Search ........ 327/205–206, 327/208, 210, 53–54, 66–67, 82, 404; 323/315, 323/316

See application file for complete search history.

(56) References Cited

U.S. PATENT DOCUMENTS

| | | | |
|---|---|---|---|
| 4,868,485 A | * | 9/1989 | Ashizaki ..................... 323/316 |
| 5,666,068 A | | 9/1997 | Ehmann |
| 5,958,026 A | | 9/1999 | Goetting et al. |
| 6,642,699 B1 | * | 11/2003 | Gregoire, Jr. ............... 323/314 |
| 6,741,195 B1 | * | 5/2004 | Cho .......................... 341/136 |
| 6,819,092 B1 | * | 11/2004 | Bretschneider ............. 323/313 |
| 6,831,503 B1 | * | 12/2004 | La Rosa ..................... 327/541 |

* cited by examiner

*Primary Examiner*—My-Trang Nu Ton
(74) *Attorney, Agent, or Firm*—Hogan & Hartson L.L.P.

(57) ABSTRACT

An Input Output Block (IOB) provides programmable hysteresis to support multiple IO standards including a differential amplifier having one input coupled to an input signal and its second input coupled to a complementary input signal in the case of differential signalling, or to a reference voltage for the case of single-ended signalling, a pair of series coupled digital inverters coupled to one output of said differential amplifier, one or more transistors coupled in parallel with each input transistor of the differential amplifier, each transistor of each parallel coupled set being of a different size relative to the corresponding input transistor, the control terminal of each parallel coupled transistor in each set being coupled to the output of one of said series coupled inverters such that positive feedback is provided directly or indirectly through a selection switch, and hysteresis control bits that symmetrically enable or disable each said selection switch to provide a programmable level of hysteresis that is determined by the combination of selection switches that are enabled and the relative sizes of the corresponding parallel coupled transistors.

20 Claims, 9 Drawing Sheets

Note: V $H_{MAX}$ is maximum hysteresis which can be incorporated for a particular standard.
VIH is the minimum high input voltage
VIL is the maximum low input voltage
$VH_{MAX}$ = VIH-VIL

US 7,154,318 B2

INPUT/OUTPUT BLOCK WITH PROGRAMMABLE HYSTERESIS

RELATED APPLICATION

The present application claims priority of Indian Patent Application No. 1430/Del/2003 filed Nov. 18, 2003.

FIELD OF THE INVENTION

This invention relates to Input/Output Blocks (IOBs) in integrated circuits. More particularly, the invention relates to IOBs with programmable hysteresis to support multiple IO standards for providing optimum noise margins.

BACKGROUND OF THE INVENTION

Hysteresis is an effective technique for enhancing the noise immunity of a logic circuit. High-speed switching circuits, where the switching speed is very high and input swing is very low are especially sensitive to noise. In such applications a precisely defined hysteresis voltage plays an important role in minimizing the effect of glitch signals. Different technologies supports different voltages i.e. the operating voltages and definition of the lower limit of threshold high (VIHmin) and upper limit of low (VILmax) level voltage varies with the technology used.

FIG. 1 shows the value of VIHmin and VILmax for GTL, GTL+, HSTL, SSTL, LVPECL, LVDS or AGP technologies. As is apparent from the figure these technologies support different hysteresis voltage levels (VIHmin–VILmax) e.g., for HSTL, VIHmin is 0.85V while VILmax is 0.65V for a reference voltage of 0.75V yielding a maximum hysteresis voltage of 200 mV around the reference voltage. On the other hand, GTL technology has VIHmin=0.85V and VILmax=0.75V for a reference voltage of 0.8V and can thus accommodate a hysteresis voltage of only 100 mV around 0.8 V. Similarly, other standards require different hysteresis values.

It is desired that an integrated circuit should support all available technologies specially when the circuit is expected to have a varying interface. For such cases the IOBs of the integrated circuit need to provide a control mechanism for adjusting the hysteresis according to requirements.

FIG. 2 is the simplified circuit diagram of an IOB in accordance with U.S. Pat. No. 5,958,026. This IOB can support the HSTL, GTL, GTL+IO standards which have a reference voltage VREF below 0.7V. The circuit operates as comparator whose trip voltage is set at VREF and whenever the signal crosses VREF the output changes. These type of IOBs do not provide any hysteresis option and hence a small amount of noise in the inputs can result in a false output.

FIG. 3 shows a similar IOB using inverted logic. The operation of this IOB is similar to that of FIG. 2. This IOB can support SSTL2, SSTL3 and LVPECL IO standards without hysteresis.

FIG. 4 shows an input receiver used for GTL according to U.S. Pat. No. 5,666,068. This circuit is basically a PMOS differential amplifier having two reference voltages Vin1 and Vin2. Transistors P3 and P4 are the input transistors while transistors P8 and P9 coupled in parallel with P3 and P4, respectively, are used to provide hysteresis. This circuit provides a hysteresis value that is capable of satisfying the GTL standard only. Further, though the hysteresis voltage can be changed by varying the reference voltages Vin1 and Vin2, this is not practically feasible since the sizes of the transistors are fixed in a circuit Therefore this circuit does not provide the flexibility to support different technologies.

What is desired, therefore, is a need to develop a system and method that provides a programmable hysteresis voltage to support different technology standards.

SUMMARY OF THE INVENTION

A method and system according to an embodiment of the present invention provides a programmable hysteresis voltage for supporting different technology standards. According to an embodiment of the present invention, an improved Input Output Block (IOB) providing programmable hysteresis includes:

a differential amplifier having one input coupled to an input signal and its second input coupled to a complementary input signal in the case of differential signaling, or to a reference voltage for the case of single-ended signaling, a pair of series coupled digital inverters coupled to one output of said differential amplifier, one or more transistors coupled in parallel with each input transistor of the differential amplifier, each transistor of each parallel coupled set being of a predetermined size relative to the corresponding input transistor, the control terminal of each parallel coupled transistor in each set being coupled to the output of one of said series coupled inverters such that positive feedback is provided directly or indirectly through a selection switch, and hysteresis control bits that symmetrically enable or disable each said selection switch to provide a programmable level of hysteresis that is determined by the combination of selection switches that are enabled and the relative sizes of the corresponding parallel coupled transistors.

The number and relative sizes of the parallel coupled transistors in the two sets are selected to provide the programmable hysteresis levels corresponding to a desired range of logic families.

The present invention also provides a method for providing programmable hysteresis in an Input Output Block (IOB), including:

providing a differential amplifier having one input coupled to an input signal and its second input coupled to a complementary input signal in the case of differential signaling, or to a reference voltage for the case of single-ended signaling, coupling a pair of series coupled digital inverters to one output of said differential amplifier, coupling one or more transistors in parallel with each input transistor of the differential amplifier, each transistor of each parallel coupled set being of a predetermined size relative to the corresponding input transistor, coupling the control terminal of each parallel coupled transistor in each set being to the output of one of said series coupled inverters such that positive feedback is provided directly or indirectly through a selection switch, and providing hysteresis control bits that symmetrically enable or disable each said selection switch to provide a programmable level of hysteresis determined by the combination of selection switches that are enabled and the relative sizes of the corresponding parallel coupled transistors.

The number and relative sizes of the parallel coupled transistors in the two sets are selected to provide the programmable hysteresis levels corresponding to a desired range of logic families.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

Figure 1:
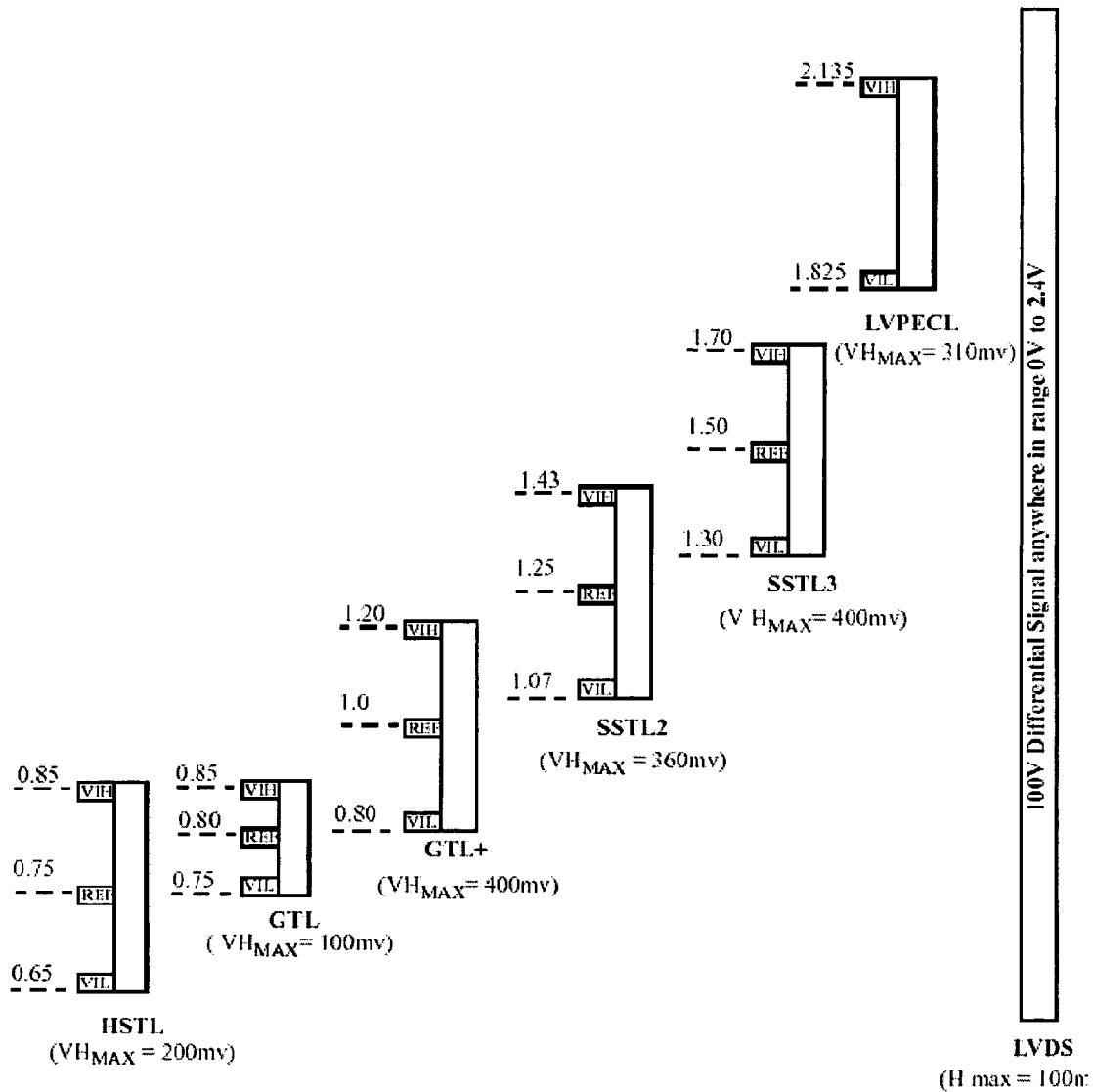
FIG. 1 shows different technology standard and voltage definitions.
Figure 2:
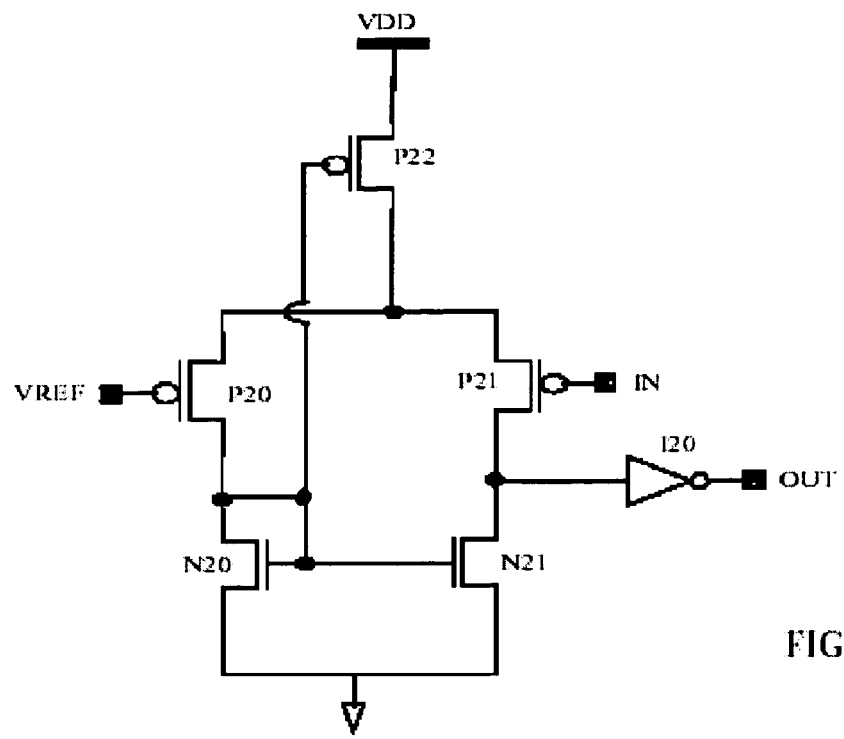
FIG. 2 shows a prior art differential IOB in accordance with U.S. Pat. No. 5,958,026.
Figure 3:
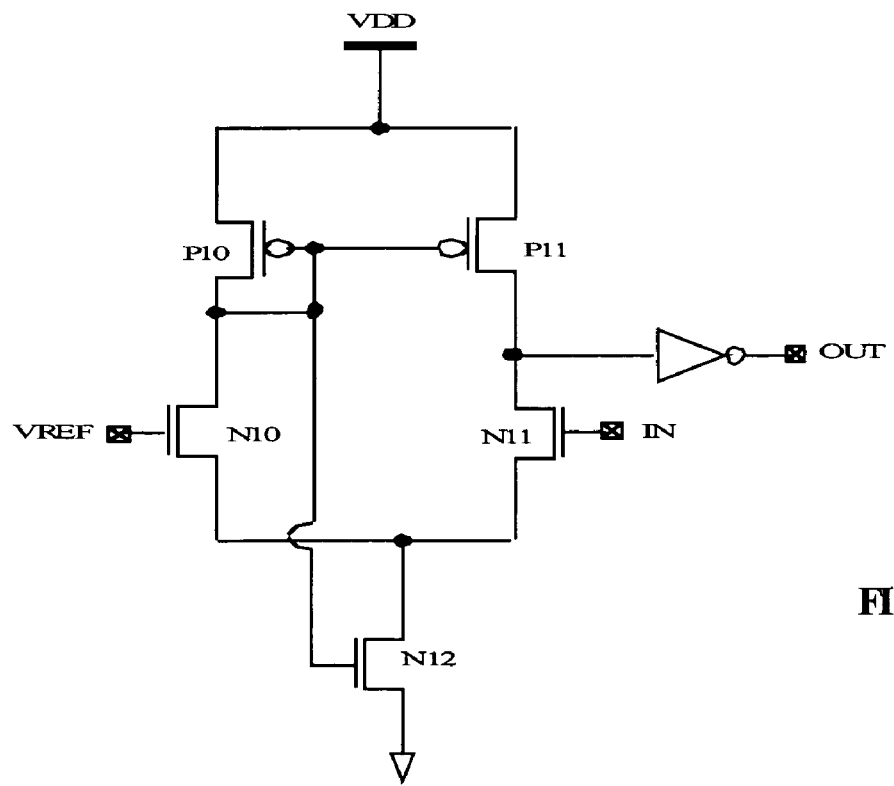
FIG. 3 shows another prior art differential IOB in accordance with U.S. Pat. No. 5,958,026.
Figure 4:
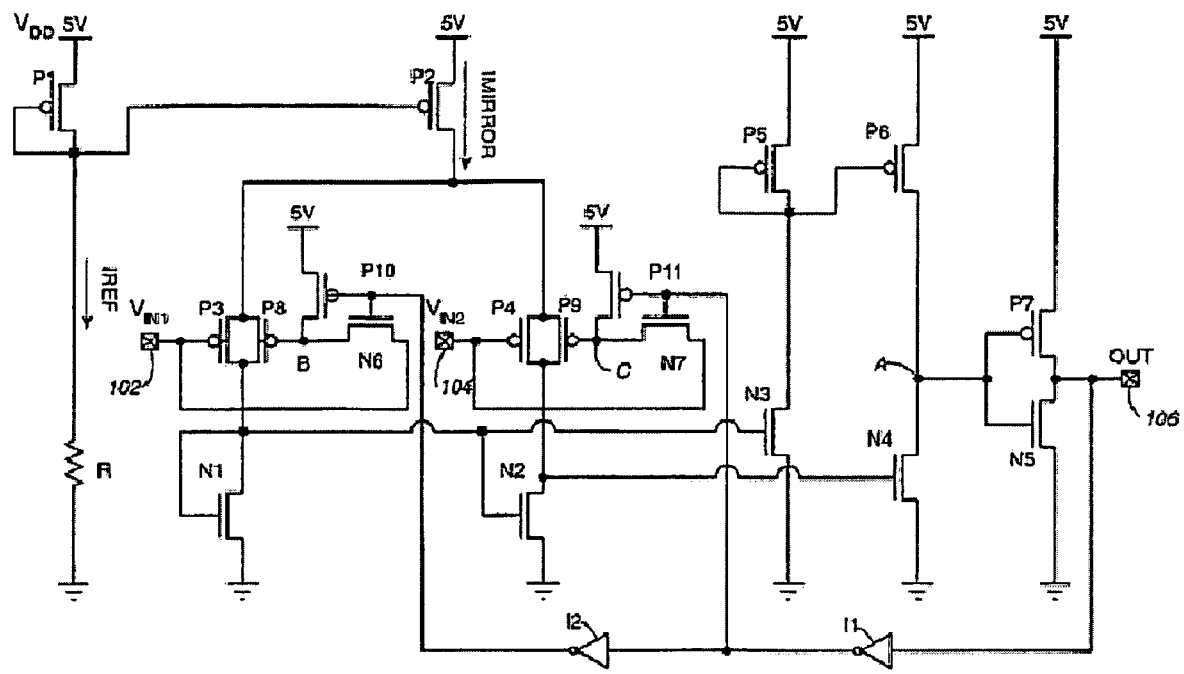
FIG. 4 shows a prior art IOB in accordance with U.S. Pat. No. 5,666,068.
Figure 5:
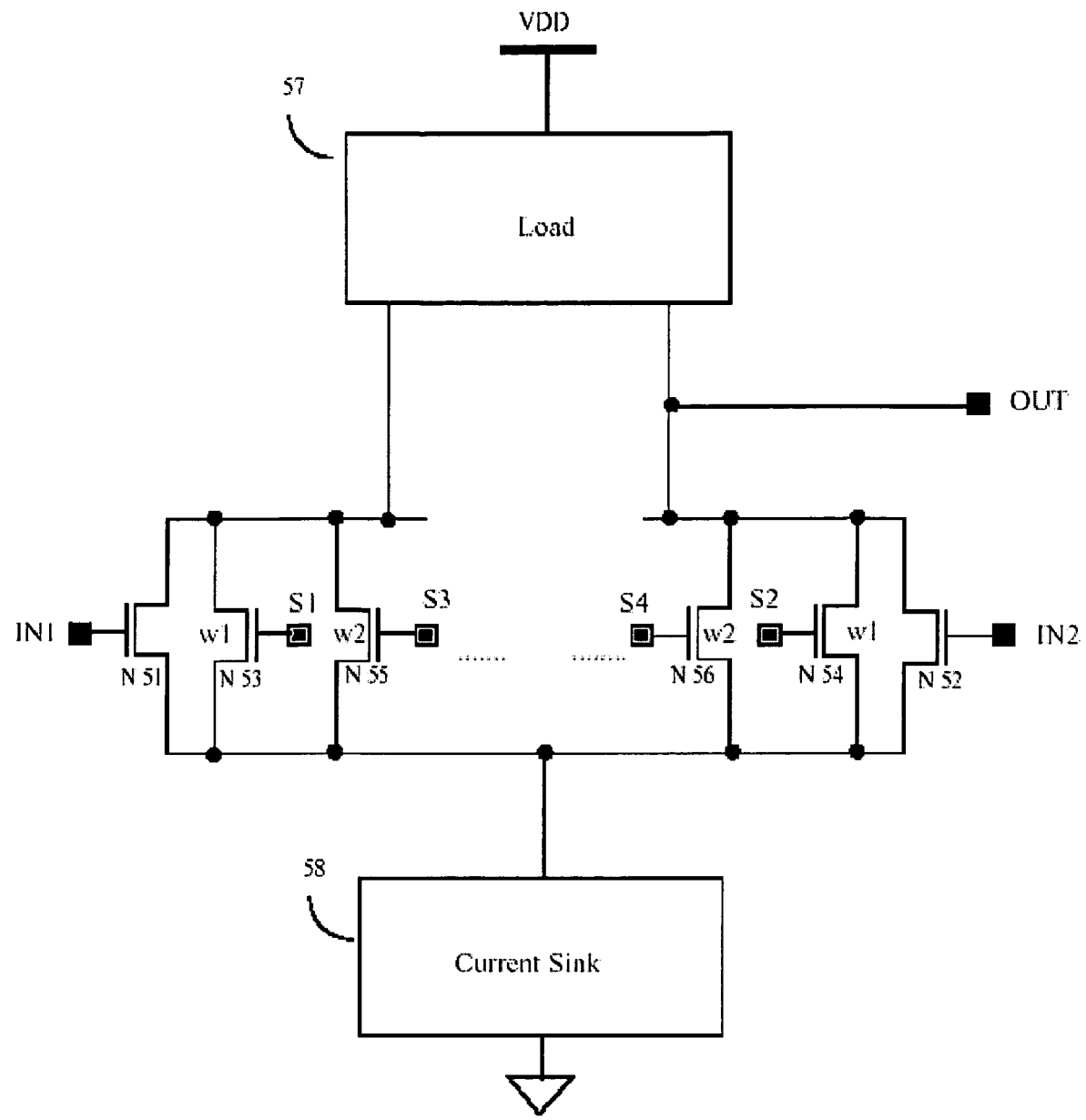
FIG. 5 shows an IOB in accordance with an embodiment of the present invention.

FIG. 5 shows a basic IOB in accordance with an embodiment of the present invention. The IOB has an NMOS differential input receiver comprising block 57 that is a load, and block 58 which is a current sink circuit. The load 57 is coupled to the current sink 58 through input transistors N51 and N52. Transistor N51 is controlled by input IN1 while transistor N52 is controlled by input IN2. For differential standards, IN1 and IN2 are differential inputs while for single ended standards IN2 is a reference voltage. Each input transistor N51, N52 has multiple transistors (only N53, N54, N55 and N56 are shown here) coupled in parallel with it as shown in the figure. Each transistor is of a predefined size to control the resistance offered by both the branches of input transistors. The transistors N53 and N54 are controlled by S1 and S3 while N54 and N56 are controlled by S2 and S4 respectively. The control signals S1, S2, S3 and S4 are generated by configuration bits and some feedback means. The parallel transistors are selectively enabled to provide a desired hysteresis voltage. This IOB can support standards whose input swings are towards VDD where VDD is the supply voltage. For example, this receiver can be used to support SSTL2, SSTL3, LVPECL etc. standards.

If the transistors N53 and N54 have width w1 and the transistors N55 and N56 are of the width w2 then variable hysteresis for different standards can be achieved by selecting the proper combinations of parallel transistors pairs (N53, N54 and N55, N56. For IO standards which require small value of hysteresis, only one combination of parallel transistor pair, say N53 and N54, are sufficient. In such a case, configuration bits enable N53 and N54 while N55 and N56 are disabled. Similarly, for standards which required a higher value of hysteresis both pairs of parallel transistor can be enabled by the configuration bits. Here only two pair of parallel transistors are shown, but the number can be varied depending upon the value of hysteresis required for different standards.

Figure 6:
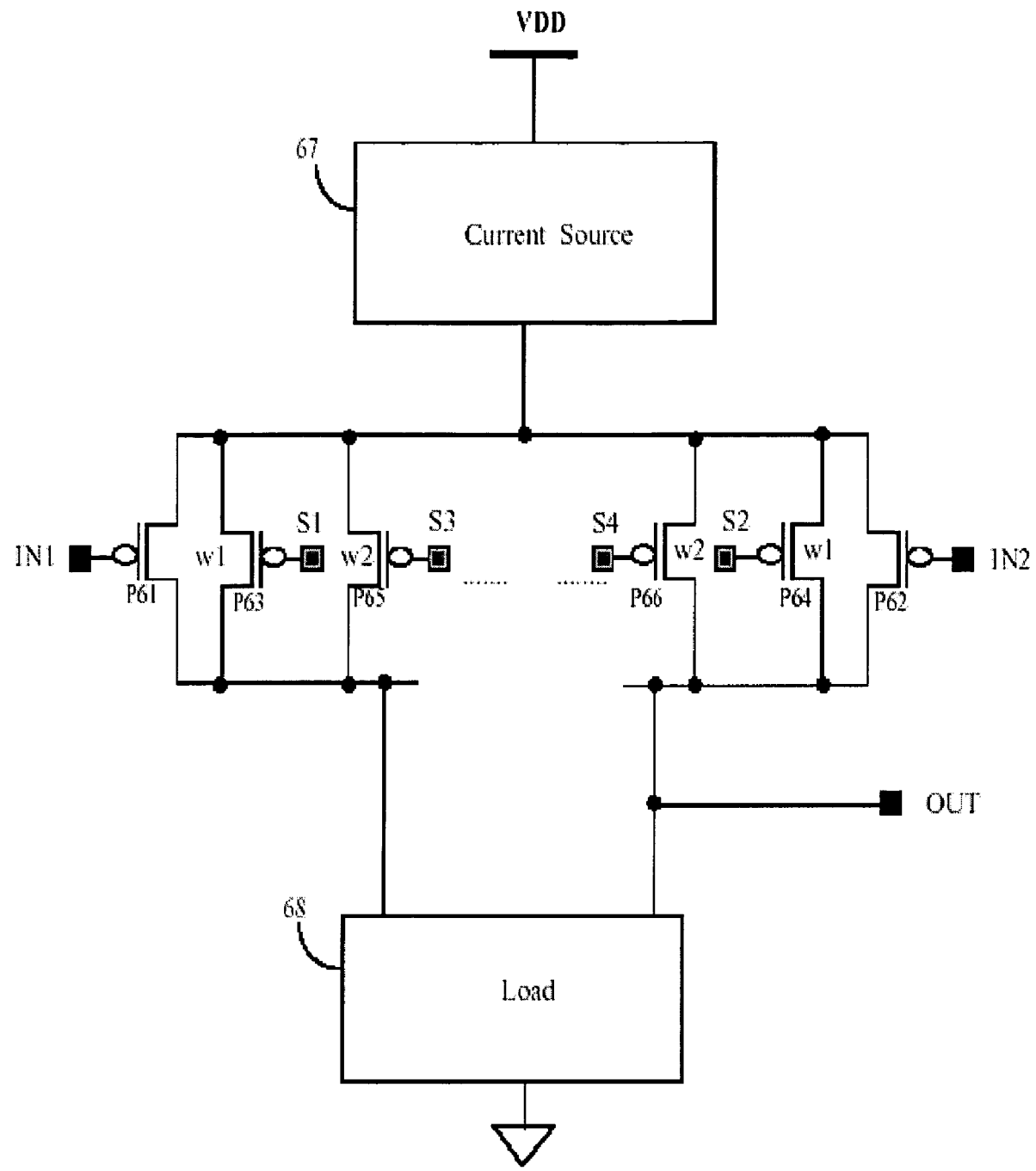
FIG. 6 shows another embodiment of the IOB in accordance with an embodiment of the present invention.

FIG. 6 shows an IOB in accordance with an embodiment of the present invention for inverted logic. It can be used to support HSTL, GTL, GTL+ etc. IO standards.

As shown in FIG. 5 and FIG. 6, transistors are coupled in parallel with the input transistors to provide hysteresis. These parallel transistors can be programmatically switched ON and OFF by the configuration bits to provide different value of hysteresis for different standards. In this manner, various IO standards can be supported with optimum hysteresis or noise margin.

Figure 7:
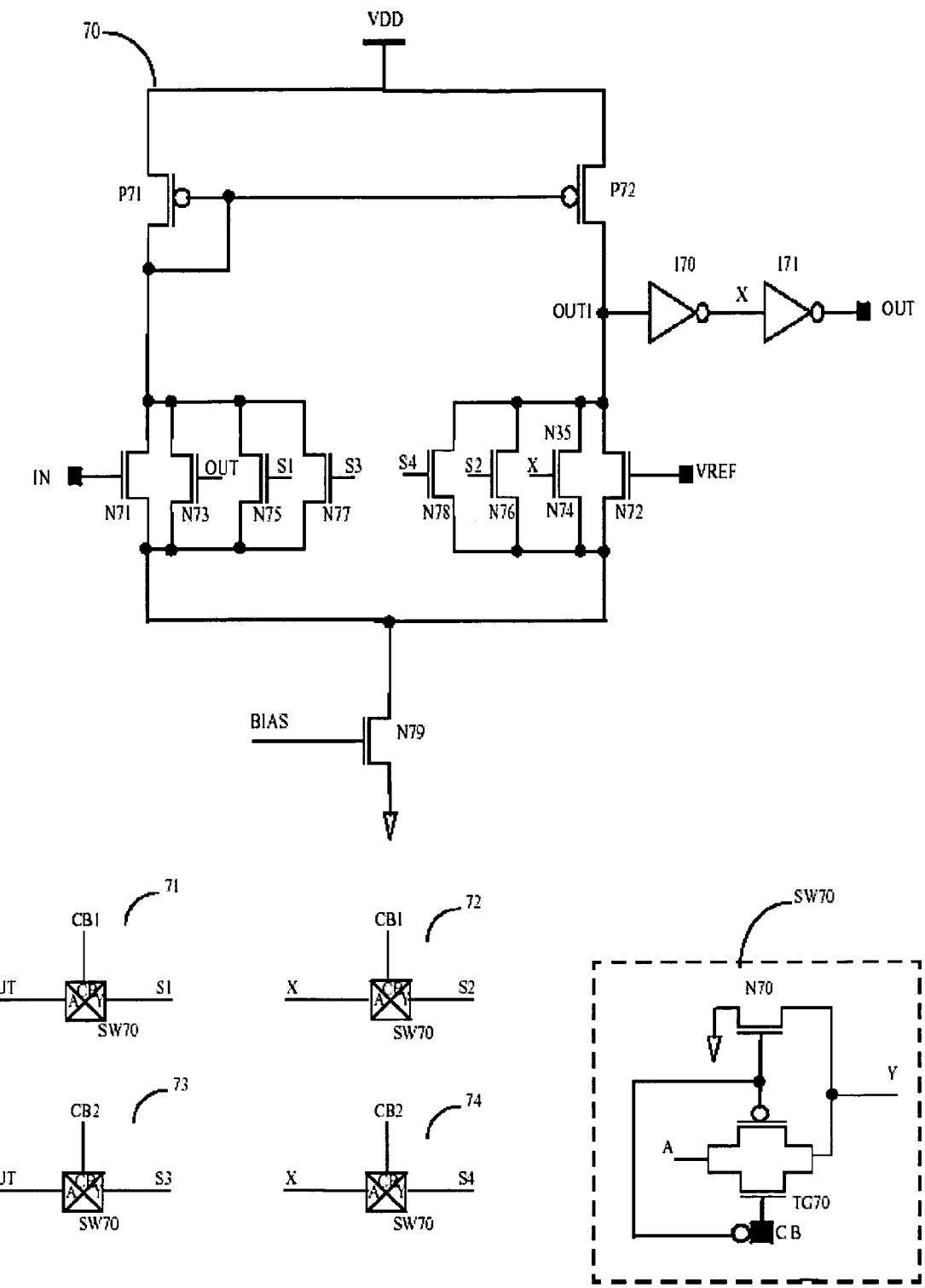
FIG. 7 shows another embodiment of the IOB in accordance with an embodiment of the present invention.

FIG. 7 shows one of the possible embodiments in accordance with the present invention. The circuit has a load realized by transistors P71 and P72 and transistor N79 is the current sink. The sources of P71 and P72 are coupled to VDD while their gates are coupled together with the drain of P71. The gate of N79 is coupled to some bias voltage at which the circuit can sink the desired amount of current. The drain of N79 is coupled with the sources of input voltage transistors N71 and N72 while its source is coupled to ground. Transistors N71 and N72 are the input transistors and transistors N73, N74, N75, N76, N77 and N78 are the transistors coupled in parallel to the input transistors as shown in FIG. 7. At least one transistor of the parallel-coupled transistor has its control terminal coupled to the output of the circuit and also at least one transistor has its control terminal coupled to the inverted output of the circuit as shown in FIG. 7. The rest of the control terminals of the said parallel-coupled transistors are coupled to signals S1, S2 etc., which are used to control the states of the parallel transistors. The drain of N71 is coupled to the drain of P71 while its source is coupled to the drain of N79. The source of N72 is coupled to the drain of N79 while its drain is coupled to the drain of P72 which is the OUT1 terminal. Two inverters 170 and 171, are coupled back to back with OUT1 as input and OUT as output terminal. The gate of N73 is coupled to the receiver output OUT while the gate of N74 is coupled to the inverted form of receiver output X. The gates of N75 and N77 are coupled to S1 and S3 respectively while the gates of N76 and N78 are coupled to S2 and S4 respectively. The control signals S1, S2, S3 and S4 are generated by the switch SW70 and configuration bits CB1 and CB2.

FIG. 7 also shows switch SW70 consisting of transmission gate TG70 and NMOS N70. The switch is controlled by configuration bit CB. When configuration bit CB is high, TG70 couples Y to A; for this case N70 is OFF. When CB is low, TG70 is OFF and N70 is ON; this makes output Y low. Blocks 71, 72, 73 and 74 are used to generate S1, S2, S3 and S4 that control the states of the parallel transistors.

When CB1 and CB2 are both LOW i.e. CB1=0, CB2=0, SW70 couples S1, S2, S3 and S4 to ground. This makes N75, N76, N77 and N78 OFF. In this case N73 and N74 are conducting since they are directly coupled to OUT and X. These two transistors provide a hysteresis value which is sufficient to support standards which required minimum hysteresis. For example, LVPECL is supported, which can have a maximum hysteresis of 310 mV. To support SSTL2, which requires a higher value of hysteresis, another branch comprising parallel transistors N75 and N76 can be turned ON by making configuration bit CB=1. In this manner, standards which require more hysteresis can be supported by turning ON all the branch of parallel transistors by making CB1=1 and CB2=1. The sizing of the parallel transistors can be chosen such that the various standards can be supported by selecting the appropriate combination of parallel transistors.

Figure 8:
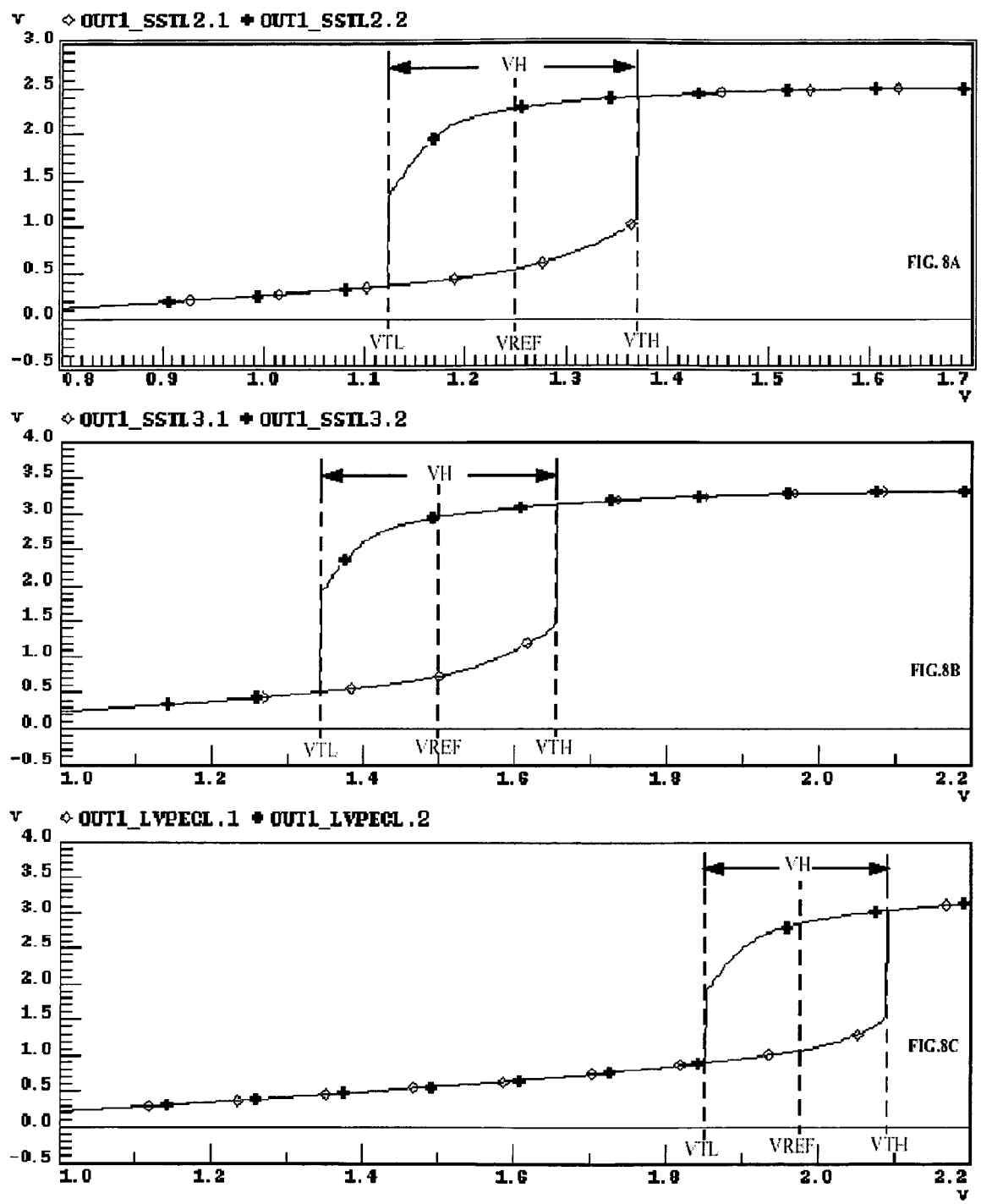
FIGS. 8A, 8B, and 8C show computer simulation results for the IOB of FIG. 7.

FIGS. 8A, 8B, 8C shows the hysteresis characteristics of various standards obtained by computer simulation of the circuit shown in FIG. 6. FIG. 8A shows the hysteresis characteristics for the LVPECL standard. The desired hysteresis for LVPECL can be achieved by configuring CB1=0 and CB2=0. In this case N75, N76, N77 and N78 are all OFF. FIG. 8B shows the hysteresis characteristics of FIG. 6 for the SSTL2 standard. In this case CB1=1 and CB2=0. FIG. 8C shows the hysteresis characteristics of FIG. 6 for the SSTL3 standard and in this case CB1=1 and CB2=1. As apparent from FIGS. 8A, 8B and 8C the hysteresis characteristic is symmetrical and evenly spread about the reference voltage VREF for all the standards. The hysteresis characteristic has two threshold voltages. One threshold voltage is used for the low to high output transition, VTH and the other threshold voltage is used for the high to low output transition, VTL. This means that the output will only be high when the input is VTH or higher. Similarly, the output will be low when the input is VTL or lower. By this way a noise of width VTH–VTL can be eliminated.

Figure 9:
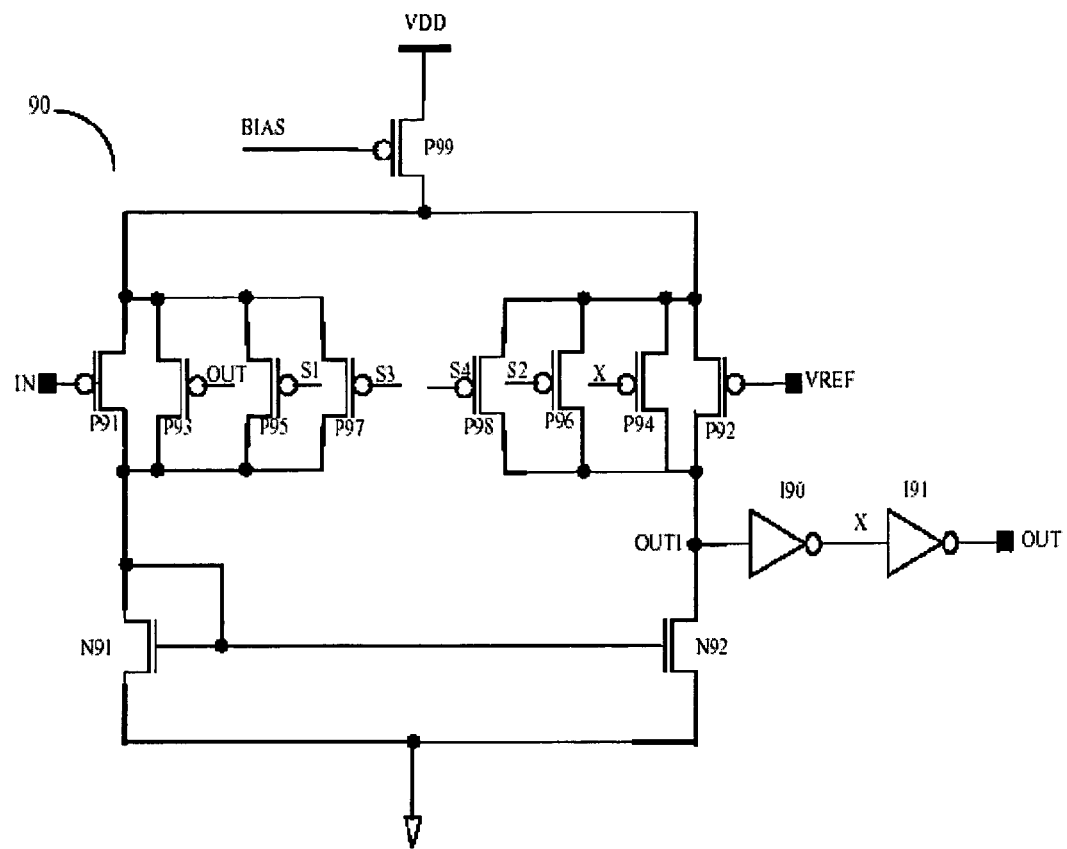
FIG. 9 shows another embodiment of the IOB in accordance with an embodiment of the present invention.
Figure 9:
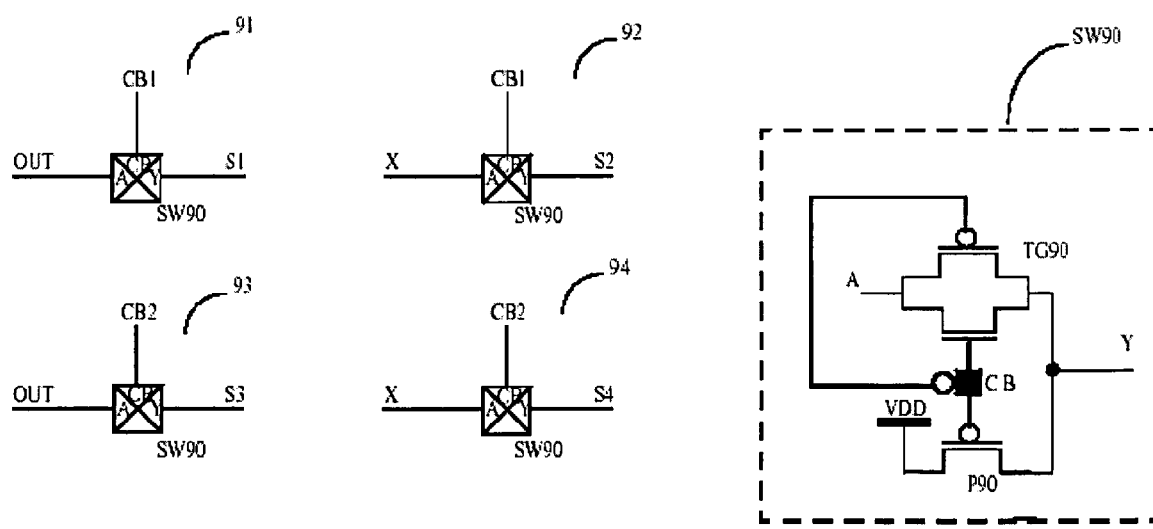
Figure 10:
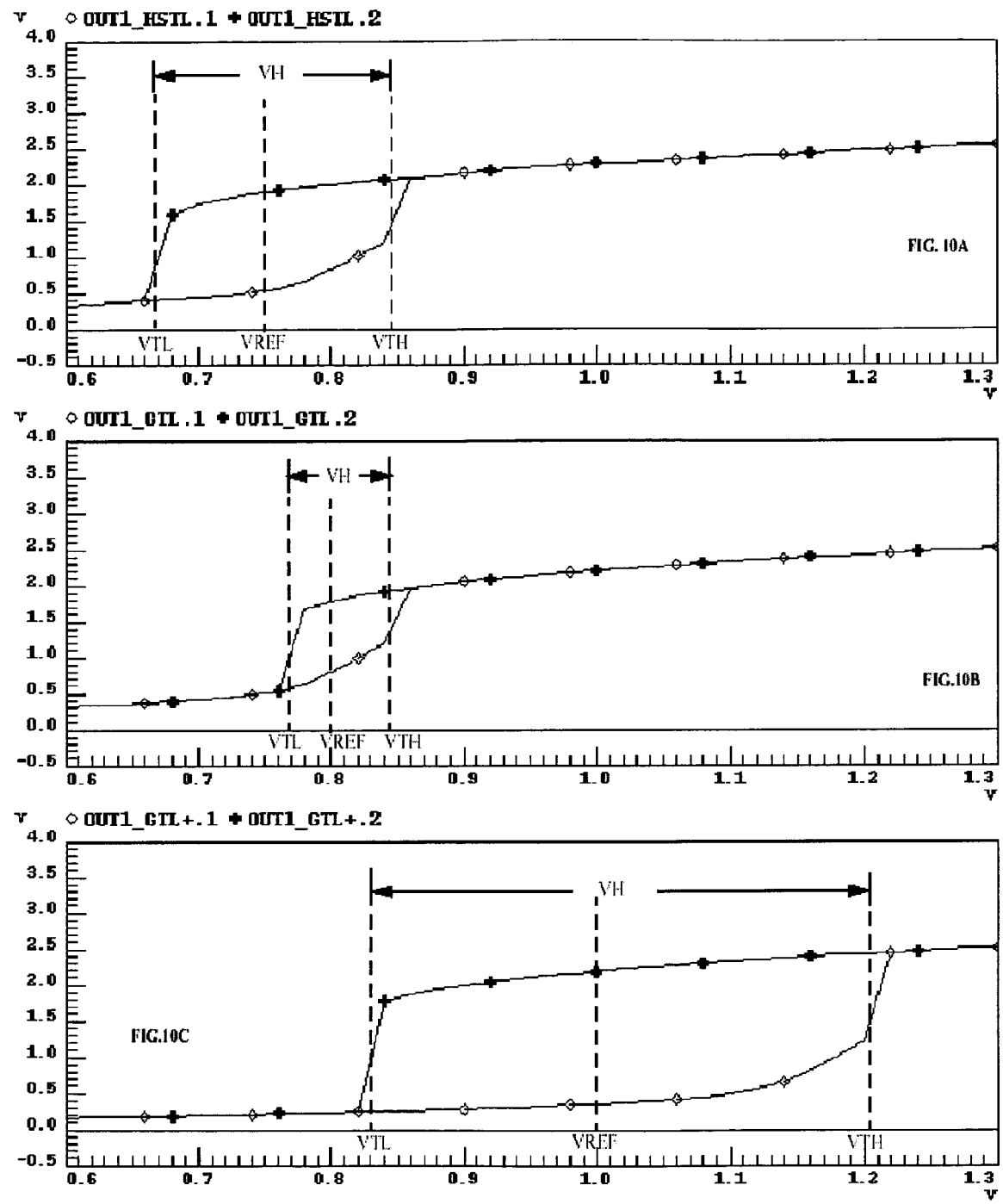
FIGS. 10A, 10B, and 10C show computer simulation results for the IOB of FIG. 9.

FIG. 9 shows another embodiment of the invention for inverted logic. A person skilled in art will appreciate that the circuit operation of the FIG. 9 remains the same as that of the circuit shown in FIG. 7 except for the polarity of the supply. FIG. 10 are the simulation results corresponding to the embodiment shown in FIG. 9.

In FIG. 7 and FIG. 9, by varying the number of parallel pair transistors, various standards can be supported with optimum hysteresis. While FIG. 7 and FIG. 9 show an implementation as an NMOS differential amplifier and PMOS differential amplifier respectively, a person in the art will appreciate that the same concept can also be realized in a combination of both NMOS and PMOS differential amplifiers. The present discussion is only an illustrative description of the invention and the scope of the invention is not limited to the circuits described.

It will be apparent to those with ordinary skill in the art that the foregoing is merely illustrative intended to be exhaustive or limiting, having been presented by way of example only and that various modifications can be made within the scope of the above invention.

Accordingly, this invention is not to be considered limited to the specific examples chosen for purposes of disclosure, but rather to cover all changes and modifications, which do not constitute departures from the permissible scope of the present invention. The invention is therefore not limited by the description contained herein or by the drawings, but only by the claims.

We claim:

1. An improved Input Output Block (IOB) providing programmable hysteresis to support multiple IO standards comprising:
    a differential amplifier having one input coupled to an input signal and its second input coupled to a complementary input signal in the case of differential signaling, or to a reference voltage for the case of single-ended signaling;
    one or more transistors coupled in parallel with each input transistor of the differential amplifier, each transistor of each parallel coupled set being of a predetermined size relative to the corresponding input transistor;
    the control terminal of each parallel coupled transistor in each set being coupled to the output of one of said series coupled inverters such that positive feedback is provided directly or indirectly through a selection switch; and
    hysteresis control bits that symmetrically enable or disable each said selection switch to provide a programmable level of hysteresis that is determined by the combination of selection switches that are enabled and the relative sizes of the corresponding parallel coupled transistors.

2. An improved Input Output Block (IOB) providing programmable hysteresis to support multiple IO standards as claimed in claim 1, wherein the number and relative sizes of the parallel coupled transistors in the two sets are selected to provide the programmable hysteresis levels corresponding to a desired range of logic families.

3. A method for providing programmable hysteresis in an Input Output Block (IOB) to support multiple IO standards, comprising:
    providing a differential amplifier having one input coupled to an input signal and its second input coupled to a complementary input signal in the case of differential signaling, or to a reference voltage for the case of single-ended signaling;
    coupling one or more transistors in parallel with each input transistor of the differential amplifier, each transistor of each parallel coupled set being of a predetermined size relative to the corresponding input transistor;
    coupling the control terminal of each parallel coupled transistor in each set being to the output of one of said series coupled inverters such that positive feedback is provided directly or indirectly through a selection switch; and
    providing hysteresis control bits that symmetrically enable or disable each said selection switch to provide a programmable level of hysteresis determined by the combination of selection switches that are enabled and the relative sizes of the corresponding parallel coupled transistors.

4. A method for providing programmable hysteresis in an Input Output Block (IOB) to support multiple IO standards as claimed in claim 3, wherein the number and relative sizes of the parallel coupled transistors in the two sets are selected to provide the programmable hysteresis levels corresponding to a desired range of logic families.

5. A programmable hysteresis circuit comprising:
    a load having a power terminal coupled to a source of supply voltage, and first and second load terminals;
    a current sink having a power terminal coupled to ground and a current sink terminal;
    a first plurality of transistors each having a current path coupled between the first load terminal and the current sink terminal;
    a second plurality of transistors each having a current path coupled between the second load terminal and the current sink terminal;
    a first input terminal coupled to a gate of one of the first plurality of transistors;
    a second input terminal coupled to a gate of one of the second plurality of transistors;
    a first plurality of configuration terminals respectively coupled to gates of the remaining first plurality of transistors;
    a second plurality of configuration terminals respectively coupled to gates of the remaining second plurality of transistors; and an output terminal coupled to the second load terminal, a gate of one of the first plurality of transistors receiving an output signal and a gate of one of the second plurality of transistors receiving an inverted output signal.

6. The programmable hysteresis circuit of claim 5 wherein the load comprises a P-channel current mirror.

7. The programmable hysteresis circuit of claim 5 wherein the current sink comprises an N-channel transistor.

8. The programmable hysteresis circuit of claim 5 wherein the first plurality of transistors comprises a plurality of N-channel transistors.

9. The programmable hysteresis circuit of claim 5 wherein the second plurality of transistors comprises a plurality of N-channel transistors.

10. The programmable hysteresis circuit of claim 5 further comprising two serially-coupled inverters coupled to the output terminal.

11. The programmable hysteresis circuit of claim 5 wherein the hysteresis supported comprises hysteresis corresponding to at least two of the GTL, GTL+, HSTL, SSTL2, SSTL3, LVPECL, LVDS or AGP technologies.

12. The programmable hysteresis circuit of claim 5 wherein the transistors in the first and second plurality of transistors are sized to provide a plurality of different hysteresis values.

13. A programmable hysteresis circuit comprising:
a load having a power terminal coupled to ground, and first and second load terminals;
a current source having a power terminal coupled to a source of supply voltage and a current source terminal;
a first plurality of transistors each having a current path coupled between the first load terminal and the current source terminal;
a second plurality of transistors each having a current path coupled between the second load terminal and the current source terminal;
a first input terminal coupled to a gate of one of the first plurality of transistors;
a second input terminal coupled to a gate of one of the second plurality of transistors;
a first plurality of configuration terminals respectively coupled to gates of the remaining first plurality of transistors;
a second plurality of configuration terminals respectively coupled to gates of the remaining second plurality of transistors; and
an output terminal coupled to the second load terminal, a gate of one of the first plurality of transistors receiving an output signal and a gate of one of the second plurality of transistors receiving an inverted output signal.

14. The programmable hysteresis circuit of claim 13 wherein the load comprises an N-channel current mirror.

15. The programmable hysteresis circuit of claim 13 wherein the current source comprises a P-channel transistor.

16. The programmable hysteresis circuit of claim 13 wherein the first plurality of transistors comprises a plurality of P-channel transistors.

17. The programmable hysteresis circuit of claim 13 wherein the second plurality of transistors comprises a plurality of P-channel transistors.

18. The programmable hysteresis circuit of claim 13 further comprising two serially-coupled inverters coupled to the output terminal.

19. The programmable hysteresis circuit of claim 13 wherein the hysteresis supported comprises hysteresis corresponding to at least two of the GTL, GTL+, HSTL, SSTL2, SSTL3, LVRECL, LVDS or AGP technologies.

20. The programmable hysteresis circuit of claim 13 wherein the transistors in the first and second plurality of transistors are sized to provide a plurality of different hysteresis values.

* * * * *